(12) United States Patent
Ng

(10) Patent No.: US 9,359,165 B2
(45) Date of Patent: Jun. 7, 2016

(54) SHEET PROCESSING APPARATUS

(71) Applicant: Kabushiki Kaisha Toshiba, Tokyo (JP)

(72) Inventor: Youyang Ng, Kanagawa (JP)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/642,944

(22) Filed: Mar. 10, 2015

(65) Prior Publication Data
US 2015/0259172 A1 Sep. 17, 2015

(30) Foreign Application Priority Data

Mar. 13, 2014 (JP) .................... 2014-050580

(51) Int. Cl.
| | | |
|---|---|---|
| G07D 5/08 | (2006.01) |
| B65H 43/04 | (2006.01) |
| B65H 7/06 | (2006.01) |
| B65H 7/20 | (2006.01) |
| B65H 37/00 | (2006.01) |
| B65H 39/00 | (2006.01) |
| G01R 33/09 | (2006.01) |
| G01R 33/00 | (2006.01) |
| G07D 7/04 | (2016.01) |

(52) U.S. Cl.
CPC .................. *B65H 43/04* (2013.01); *B65H 7/06* (2013.01); *B65H 7/20* (2013.01); *B65H 37/00* (2013.01); *B65H 39/00* (2013.01); *G01R 33/007* (2013.01); *G01R 33/0076* (2013.01); *G01R 33/0082* (2013.01); *G01R 33/091* (2013.01); *G07D 7/04* (2013.01)

(58) Field of Classification Search
CPC ............. B65H 43/04; B65H 2301/544; B65H 2553/22; B65H 2701/1912; G01R 1/18; G01R 33/0017; G01R 33/0047; G01R 33/007; G01R 33/0091; G07K 7/08; G07K 7/082
USPC .................... 194/210, 213, 317; 235/449
See application file for complete search history.

(56) References Cited

U.S. PATENT DOCUMENTS

2012/0163696 A1* 6/2012 Ross ................ G01R 33/04
382/135

FOREIGN PATENT DOCUMENTS

| | | |
|---|---|---|
| DE | 102008033579 A1 | 1/2010 |
| JP | 2003-332781 A | 11/2003 |
| JP | 2010-103373 A | 5/2010 |
| JP | 2011075438 A | 4/2011 |

OTHER PUBLICATIONS

Extended European Search Report issued in related EU Application No. 15158389.5, mailed on Jul. 16, 2015 (6 pages).

* cited by examiner

*Primary Examiner* — Mark Beauchaine
(74) *Attorney, Agent, or Firm* — Baker Botts L.L.P.

(57) ABSTRACT

According to an embodiment, there is provided a sheet processing apparatus including a contactless type detection magnetic sensor for detecting magnetism of a sheet, correction magnetic sensors for detecting a magnetic field near the detection magnetic sensor, coils arranged near the detection magnetic sensor, and a cancel device for generating a cancellation magnetic field for cancelling a magnetic field near the detection magnetic sensor from the coils based on a detection result of the correction magnetic sensors.

17 Claims, 10 Drawing Sheets

SHEET PROCESSING APPARATUS

CROSS-REFERENCE TO RELATED APPLICATIONS

This application is based upon and claims the benefit of priority from the prior Japanese Patent Application No. 2014-050580, filed on Mar. 13, 2014, the entire contents of which are incorporated herein by reference.

FIELD

Embodiments described herein relate generally to a sheet processing apparatus.

BACKGROUND

There is known a sheet processing apparatus including a detection unit for detecting information for determining the type or authenticity of sheet or information for finding a contamination or damage of a sheet, and directed for eliminating a contaminated or damaged sheet and classifying sheets by the type. Authenticity of a sheet is determined based on a detection result from a magnetic sensor for detecting magnetism of the sheet.

However, when a machine for conveying a sheet is arranged near the magnetic sensor and magnetism of a sheet is detected by the contactless type magnetic sensor, there is a problem that a noise other than magnetism of a sheet is detected and an accuracy of detecting magnetism of a sheet is deteriorated.

DETAILED DESCRIPTION

According to an embodiment, there is provided a sheet processing apparatus including a contactless type detection magnetic sensor for detecting magnetism of a sheet, correction magnetic sensors for detecting a magnetic field near the detection magnetic sensor, coils arranged near the detection magnetic sensor, and a cancel device for generating a cancellation magnetic field for cancelling a magnetic field near the detection magnetic sensor from the coils based on a detection result of the correction magnetic sensors.

The sheet processing apparatus according to the embodiment will be described below with reference to the drawings.

Figure 1:
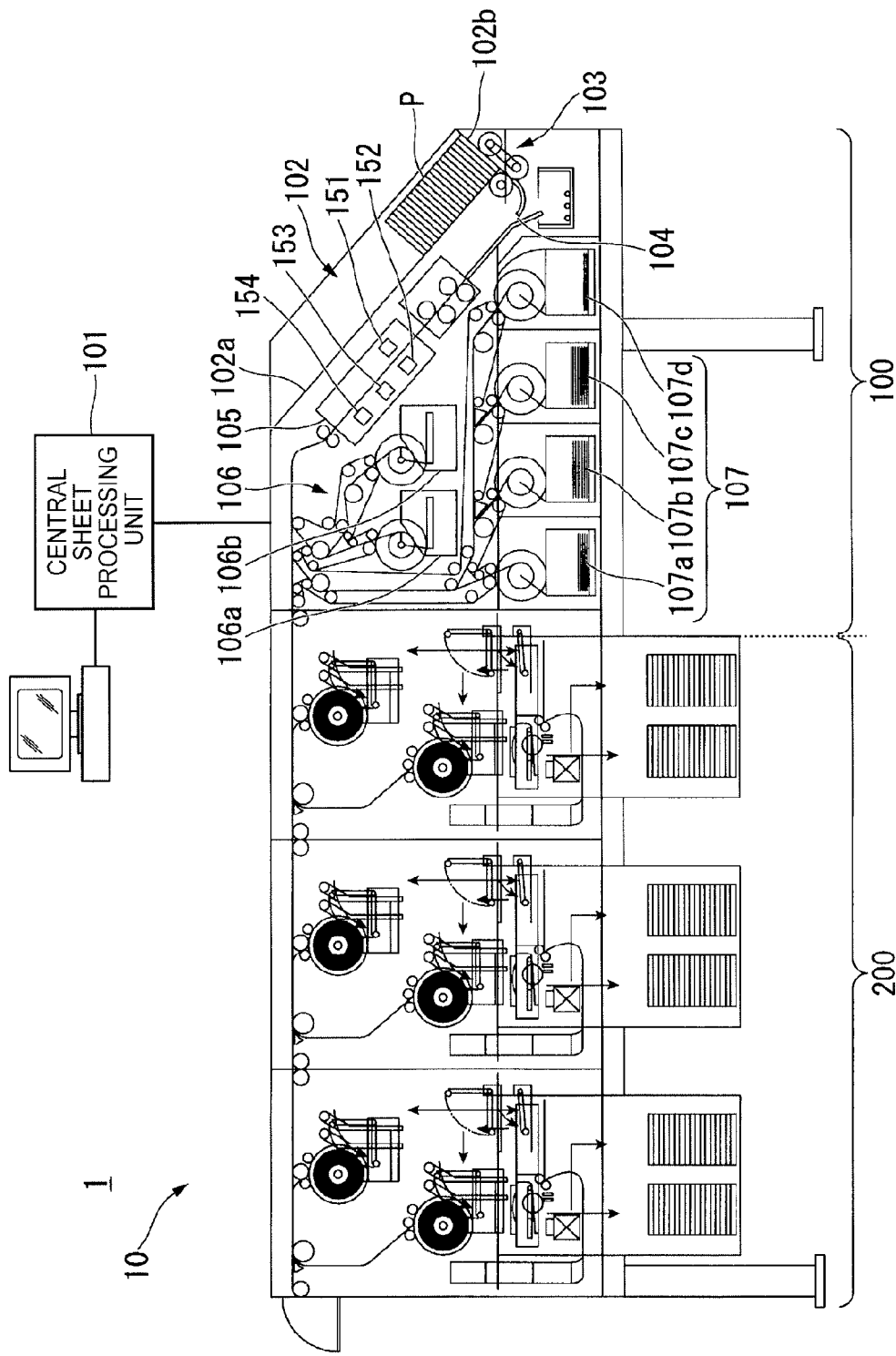
FIG. 1 is a schematic diagram illustrating an exemplary sheet processing apparatus 1 according to an embodiment.

FIG. 1 is a schematic diagram illustrating an exemplary sheet processing apparatus 1 such as paper sheet processing apparatus according to the embodiment. For example, paper notes P (bank notes) as sheets are processed in the sheet processing apparatus 1 according to the embodiment. There will be described below an example in which the sheets are paper notes P, but the sheets are not limited to paper notes P.

The sheet processing apparatus 1 includes a main unit 100, a seal unit 200, and a central sheet processing unit 101.

The main unit 100 shoots images of a paper note P and measures magnetism or the like of the paper note P while conveying the paper note P supplied from a supply unit 102. The main unit 100 outputs the shot images and the measurement results such as magnetism to the central sheet processing unit 101. The central sheet processing unit 101 makes type determination (denomination category), authenticity determination (truth/false), damage determination (fitness, namely, normal/damaged) and the like based on the information input from the main unit 100, and outputs the determination results to the main unit 100. The main unit 100 classifies the paper notes P based on the determination results by the central sheet processing unit 101.

Specifically, the main unit 100 collects, as reject sheets, a paper note P determined as false (counterfeit) in the authenticity determination by the central sheet processing unit 101, a paper note P offset from a basic posture in its conveying state, and the like. The main unit 100 eliminates paper notes P determined as damaged (unfit) in the damage determination in the central sheet processing unit 101. The main unit 100 feeds, to the seal unit 200, normal sheets determined as true (genuine) in the authenticity determination in the central sheet processing unit 101 and determined as normal (fit) in the damage determination.

In the embodiment, the reject sheets include sheets determined as false (counterfeit), folded or broken sheets, sheets determined as indiscriminable due to skew or double sheets, and the like. Skew means a state in which a paper note P is tilted relative to the conveyance direction (or a state in which a paper note P is being conveyed in a tilted state).

The seal unit 200 receives the paper notes P determined as normal by the main unit 100 from the main unit 100. The seal unit 200 seals the received paper notes P by predetermined increments, and houses the bundles of processed sheets in a housing unit.

A structure of each unit will be described below in detail.

The main unit 100 includes the central sheet processing unit 101, the supply unit 102, a supply mechanism 103, a conveyance mechanism 104, a detection device 105, a reject unit 106, and an accumulation unit 107. The main unit 100 includes drive mechanisms for driving the supply mechanism 103, the conveyance mechanism 104, the detection device 105, the reject unit 106 and the accumulation unit 107, and includes power supplies as well as various sensors.

The central sheet processing unit 101 is provided on a control board in the main unit 100, for example. The central sheet processing unit 101 includes a CPU (Central Processing Unit) for controlling the respective operations of the main unit 100 and the seal unit 200, and a memory for storing therein various items of data, control programs and management information.

The supply unit 102 can house many paper notes P in a stacked state, and can house more than 2000 paper notes P in a stacked state, for example. The supply unit 102 includes a support face 102a tilted relative to a vertical face at a predetermined angle, and a placement face 102b at the lowermost part of the supply unit 102 and orthogonal to the support face 102a. A paper note P is placed on the placement face 102b. The paper note P is housed in the supply unit 102 while the side edge of a long side of the paper note P contacts on the support face 102a.

The supply mechanism 103 includes a pickup roller, takes out the paper notes P one by one from the lowermost part of the supply unit 102, and conveys them to the conveyance mechanism 104.

The conveyance mechanism 104 conveys the paper notes P taken out by the supply mechanism 103 one by one along a predetermined conveyance path. The conveyance mechanism 104 is configured of several pairs of endless conveyance belts (not illustrated) extended to sandwich objects to be conveyed, for example. A paper note P taken out by the supply mechanism 103 is sandwiched by the conveyance belts and is conveyed from the upstream toward the downstream on the conveyance path. The conveyance path by the conveyance mechanism 104 assumes the upstream at a point where a paper note P is taken out from the supply unit 102 by the supply mechanism 103 and the downstream on the side of the reject unit 106 and the accumulation unit 107 through the detection device 105. The conveyance path by the conveyance mechanism 104 is branched into a flow path coupled to the reject unit 106 and a flow path coupled to the accumulation unit 107 on the downstream.

The detection device 105 detects a sheet conveyed by the conveyance mechanism 104. Further, the detection device 105 detects information for determining sheet type (kind), shape, thickness, top/bottom, authenticity, damage, double sheets of the paper note P, and outputs a detection result to the central sheet processing unit 101. In the embodiment, the detection device 105 includes a front face camera 151, a back face camera 152, a magnetic sensor 153, and a physical property detection sensor 154. The front face camera 151 and the back face camera 152 are installed to shoot different faces of a paper note P moving in the conveyance direction. The front face and the back face of a paper note P are determined depending on the direction of the paper note P to be conveyed, and a face shot by the front face camera 151 is assumed as front face and a face shot by the back face camera 152 is assumed as back face.

The sheet type determination of a paper note P is a processing of detecting the type of paper note P (1000-yen bill, 5000-yen bill, 10000-yen bill. Instead of yen, paper notes of dollar, euro or the like can be used) based on a pattern printed on the paper note P. The authenticity determination is a processing of determining whether the paper note P is true (genuine) or false (counterfeit) based on a reflected light from the hologram on the paper note P or a transmitted light from the watermark. The damage determination is a processing of determining whether a degree of damage of a paper note P is higher than a reference value based on the shot images of the paper note P and whether the paper note P is normal or damaged. The normal sheet is a sheet lower than the reference value in its degree of damage and recirculatable. The damaged sheet is a sheet higher than the reference value in its degree of damage and non-recirculatable.

The reject unit 106 collects sheets determined as reject sheets by the central sheet processing unit 101 based on a detection result by the detection device 105. The reject unit 106 feeds the paper notes P determined as reject sheets to a reject sheet recovery box 106a or 106b. The reject unit 106 may feed the reject sheets determined as false (counterfeit) to the reject sheet recovery box 106a in response to an instruction of the central sheet processing unit 101, and may feed the reject sheets not determined as false (such as skewed paper notes P) to the reject sheet recovery box 106b.

The accumulation unit 107 feeds the paper notes P determined as normal based on a detection result of the detection device 105 to the accumulation boxes 107a, 107b and 107c prepared per type of the paper note P depending on the type of paper note P. The accumulation boxes 107a, 107b and 107c are the collection boxes arranged in a line and directed for housing 1000-yen bills, 5000-yen bills, and 10000-yen bills, respectively, for example. The accumulation unit 107 feeds the damaged sheets among the paper notes P determined as true (genuine) based on a detection result of the detection device 105 to an accumulation box 107d.

Exemplary operations of the main unit 100 will be described below.

The supply mechanism 103 takes out the paper notes P housed in the supply unit 102 one by one and feeds them to the conveyance mechanism 104. The conveyance mechanism 104 feeds the paper notes P taken out by the supply mechanism 103 to the detection device 105 one by one. The detection device 105 detects information on type, damage, authenticity, and conveyance direction of the paper notes P conveyed by the conveyance mechanism 104, and outputs it to the central sheet processing unit 101. The central sheet processing unit 101 makes sheet type determination (denomination category), authenticity determination (truth/false) and damage determination (fitness, namely, normal/damaged) on each paper note P, for example, based on a detection result of the detection device 105. The central sheet processing unit 101 controls the conveyance mechanism 104 to feed false sheets (counterfeit) to the reject unit 106 and to feed normal sheets (fit) to the accumulation unit 107 based on a determination result.

The reject unit 106 feeds the paper notes P determined as reject sheets by the detection device 105 to the reject sheet recovery box 106a or 106b under control of the central sheet processing unit 101.

The accumulation unit 107 feeds the paper notes P determined as normal (fit) to the accumulation boxes 107a, 107b and 107c depending on the type of paper note P (denomination category) determined based on a detection result of the detection device 105 under control of the central sheet processing unit 101. The paper notes P determined as damaged (unfit) among the sheets processed by the detection device 105 are fed to the accumulation box 107d by the accumulation unit 107.

The central sheet processing unit 101 makes sheet type determination, authenticity determination, damage determination and the like on the paper notes P based on a detection result of the detection device 105.

For example, the central sheet processing unit 101 determines whether a paper note P is true (authentic sheet) or false (false sheet) based on the image data on the shot paper note P. The central sheet processing unit 101 determines authenticity based on a detection result by the sensor 154 for detecting a physical property of the paper note P. When a reflected light from the hologram on the paper note P or a transmitted light from the watermark is a predetermined pattern, for example, the central sheet processing unit 101 determines that the paper note P is true. When the amount of magnetic bodies contained in a paper note P is within a predetermined amount, for example, the central sheet processing unit 101 determines the paper note P as true.

The central sheet processing unit 101 determines a paper note P as normal when the paper note P determined as true is recirculatable, and determines it as damaged when it is not recirculatable. The central sheet processing unit 101 detects a damage such as contamination attached on a paper note P or breaking. The central sheet processing unit 101 finds a degree of damage indicating the size of the range of a detected contamination on the paper note P, the number of contaminations on the paper note P, or the size or number of braking. The central sheet processing unit 101 compares the found degree of damage with the reference value, and when the degree of damage is lower than the reference value, determines the paper note as normal. On the other hand, when the degree of damage is higher than the reference value, the central sheet processing unit 101 determines the paper note P as damaged.

Figure 2:
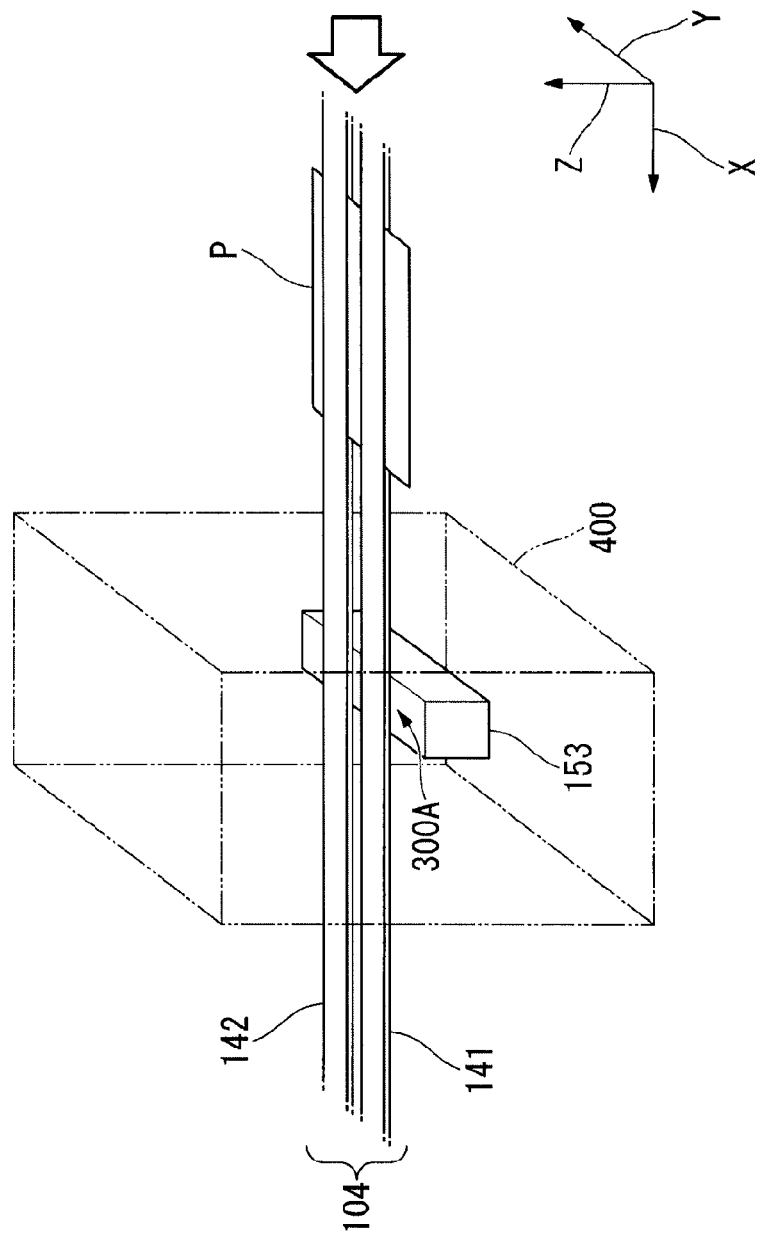
FIG. 2 is a diagram for explaining an exemplary arrangement of a magnetic sensor 153.

An exemplary arrangement of the magnetic sensor 153 will be described below with reference to FIG. 2. FIG. 2 is a diagram for explaining an exemplary arrangement of the magnetic sensor 153. Herein, a position of the magnetic sensor 153 will be described by use of the XYZ space. The X axis indicates a conveyance direction in which the conveyance mechanism 104 conveys paper notes P, where a direction from the upstream toward the downstream in the conveyance direction is the + direction of the X axis. The Y axis is orthogonal to the conveyance direction, where a direction from the left to the right in the conveyance direction is the + direction of the Y axis. The Z axis is a vertical direction, where a direction upward from below in the vertical direction is the + direction of the Z axis. In the embodiment, the XYZ space also matches with the components in the three axial directions of magnetism detected by the magnetic sensor 153.

As illustrated, the conveyance mechanism 104 includes a conveyance belt 141 arranged on the left of the conveyance direction (X) and a conveyance belt 142 arranged on the right of the conveyance direction (X). The conveyance belts 141 and 142 are configured of two belts overlapped in the vertical direction (Z), and convey a paper note P along the conveyance path with the paper note P sandwiched therebetween.

The magnetic sensor 153 is arranged below the conveyance belts 141 and 142 in the vertical direction (Z). The magnetic sensor 153 is arranged in a housing case 400. The magnetic sensor 153 includes a magnetic sensor array unit 300A on its top face or a face opposing the conveyance belts 141 and 142. The magnetic sensor array unit 300A is a contactless type magnetic sensor array, and detects magnetism of a paper note P passing in a detectable range. The detectable range is within a predetermined distance from the magnetic sensor array unit 300A. The magnetic sensor array unit 300A converts a surrounding magnetic field into an electric signal, and outputs the electric signal. In the embodiment, the magnetic sensor array unit 300A detects the magnetic components in the three axial directions, or the magnetic field decomposed in the three axial directions.

Figure 3:
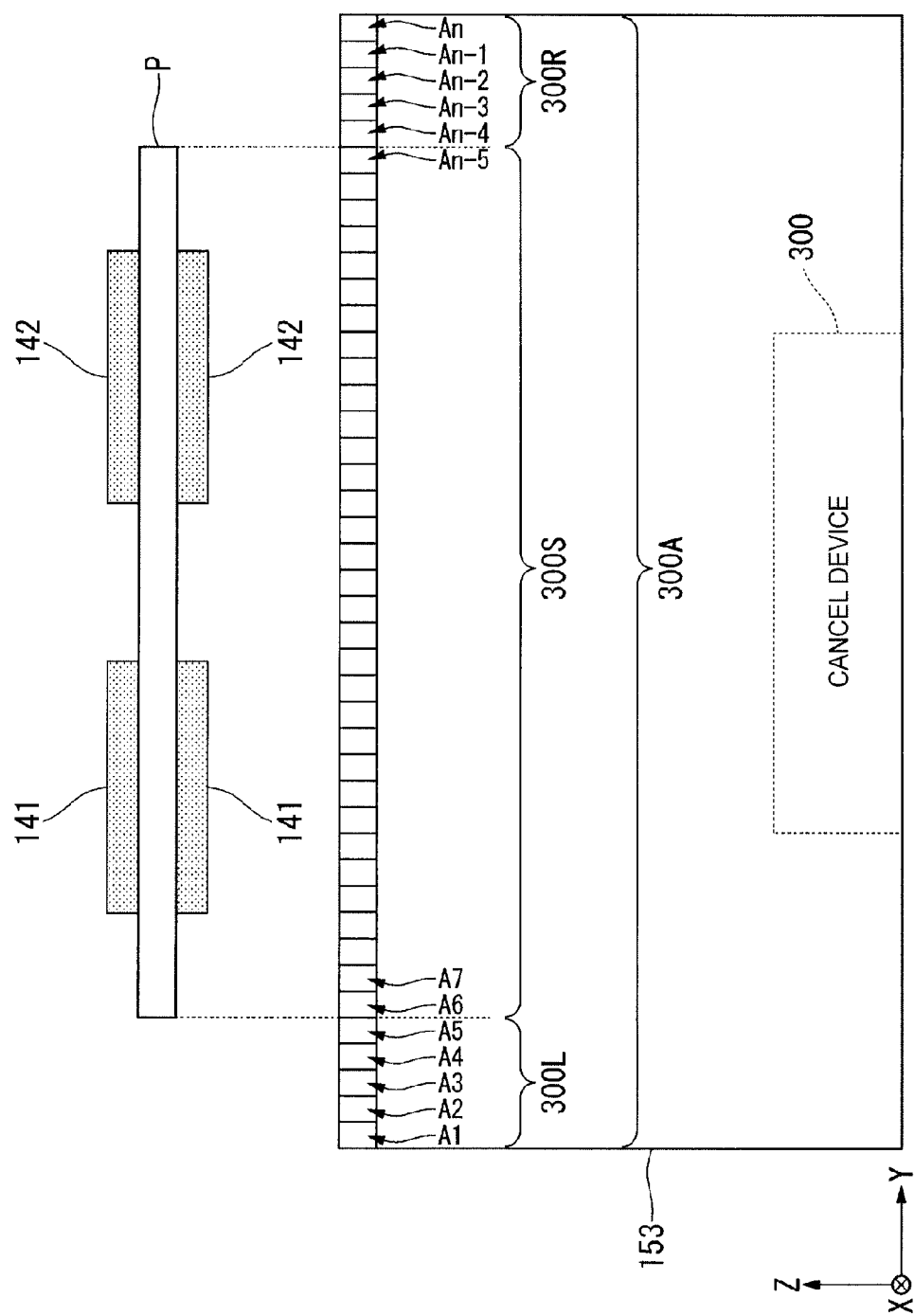
FIG. 3 is a diagram for explaining a magnetic sensor array unit 300A provided in the magnetic sensor 153.

The magnetic sensor array unit 300A provided in the magnetic sensor 153 will be described below with reference to FIG. 3. FIG. 3 is a diagram for explaining the magnetic sensor array unit 300A provided in the magnetic sensor 153.

The magnetic sensor 153 includes the magnetic sensor array unit 300A in which a plurality of magnetic sensor array elements are arranged in a line in the Y axis direction, for example. The magnetic sensor array unit 300A includes n magnetic sensor arrays A1, A2, ..., An-1, An, for example.

In the embodiment, a position through which a paper note P held by the conveyance belts 141 and 142 passes is previously determined, and a position where a paper note P and the magnetic sensor array unit 300A oppose each other is also previously determined. A part opposing a paper note P in the magnetic sensor array unit 300A is assumed as detection magnetic sensor array 300S. In the illustrated example, the magnetic sensor arrays A6 to An-5 are the detection magnetic sensor arrays 300S. The detection magnetic sensor arrays 300S are magnetic sensor arrays for detecting magnetism of a paper note P.

A part not opposing a paper note P and on the left of the conveyance direction (X) in the magnetic sensor array unit 300A is assumed as left-side correction magnetic sensor array 300L. In the illustrated example, the magnetic sensor arrays A1 to A5 are the left-side correction magnetic sensor arrays 300L. The left-side correction magnetic sensor arrays 300L are magnetic sensor arrays for detecting a magnetic field on the left of the conveyance direction (X) in the magnetic sensor 153.

A part not opposing a paper note P and on the right of the conveyance direction (X) in the magnetic sensor array unit 300A is assumed as right-side correction magnetic sensor array 300R. In the illustrated example, the magnetic sensor arrays An-4 to An are the right-side correction magnetic sensor arrays 300R. The right-side correction magnetic sensor arrays 300R are magnetic sensor arrays for detecting a magnetic field on the right of the conveyance direction (X) in the magnetic sensor 153.

The correction magnetic sensor arrays 300L, 300R can be called as corrective magnetic sensor arrays or corrective magnetic sensing element arrays.

The boundaries between the left-side correction magnetic sensor array 300L as well as the right-side correction magnetic sensor array 300R and the detection magnetic sensor arrays 300S are determined depending on a position where the magnetic sensor array unit 300A opposes a paper note P. A positional relationship between the conveyance belts 141, 142 and a paper note P held by the conveyance belts 141 and 142 is previously determined depending on the device. Thus, the boundaries may be fixed at predetermined positions, and the boundaries may be changed by the magnetic sensor 153 at a predetermined timing in response to an output from the sensor for detecting a conveyance position of the paper note P. That is, the magnetic sensor 153 can determine the magnetic sensor arrays corresponding to the detection magnetic sensor arrays 300S, the left-side correction magnetic sensor arrays 300L and the right-side correction magnetic sensor arrays 300R in the magnetic sensor array unit 300A.

The magnetic sensor 153 includes a cancel device 300 therein. The magnetic sensor array unit 300A is connected to the cancel device 300, and outputs a signal indicating a detection result to the cancel device 300. In the embodiment, the magnetic sensor arrays A6 to An-5 included in the detection magnetic sensor arrays 300S output detection magnetic electric signals $(SX_6, SY_6, SZ_6), (SX_7, SY_7, SZ_7), \ldots, (SX_{n-5}, SY_{n-5}, SZ_{n-5})$ including the magnetic components in the three axial directions, respectively. The magnetic sensor arrays A1 to A5 included in the left-side correction magnetic sensor arrays 300L output correction magnetic electric signals $(SX_1, SY_1, SZ_1), (SX, SY_2, SZ_2), \ldots, (SX_5, SY_5, SZ_5)$ including the magnetic components in the three axial directions, respectively. The magnetic sensor arrays An-4 to An included in the right-side correction magnetic sensor arrays 300R output correction magnetic electric signals $(SX_{n-4}, SY_{n-4}, SZ_{n-4}), (SX_{n-3}, SY_{n-3}, SZ_{n-3}), \ldots, (SX, SY_n, SZ_n)$ including the magnetic components in the three axial directions, respectively.

A magnetic field inside the housing case 400 includes geomagnetic noise generated by a geomagnetic field, AC magnetic noise generated by an AC power supply transmitted from a power plant, magnetic noise generated by a motor arranged near the housing case 400, or magnetic noise generated by an object having other magnetic components (which will be called environmental magnetic noise below).

The detection magnetic sensor arrays 300S detect magnetism including an environmental magnetic noise when detecting magnetism of a paper note P. Since a magnetic field generated by a paper note P is so weak, it may be lower than an environmental magnetic noise, and an electric signal of the magnetism of the paper note P may not be sufficiently acquired even if it is subjected to an electric filter processing. The magnetic sensor array unit 300A is a contactless type magnetic sensor, and thus may not sufficiently acquire an electric signal of the magnetism of the paper note P as compared with a contact type magnetic sensor.

The cancel device 300 generates a cancellation magnetic field for cancelling an environmental magnetic noise from a 3D coil unit 410 by flowing a current through the 3D coil unit 410 (see FIG. 4 to FIG. 6) provided in the housing case 400. The cancellation magnetic field compensates for an environmental magnetic noise inside the housing case 400, thereby reducing the environmental magnetic noises included in the electric signals detected by the detection magnetic sensor arrays 300S.

The left-side correction magnetic sensor arrays 300L and the right-side correction magnetic sensor arrays 300R detect an environmental magnetic noise present inside the housing case 400 in a period when a cancellation magnetic field is not generated by the 3D coil unit 410. The period in which a cancellation magnetic field is not generated by the 3D coil unit 410 is after a paper note P passes through the face opposing the magnetic sensor 153 and before a next paper note P passes through the face opposing the magnetic sensor 153, for example. Thus, when the left-side correction magnetic sensor arrays 300L and the right-side correction magnetic sensor arrays 300R detect a magnetic field corresponding to an environmental magnetic noise, magnetism of a paper note P is not included therein.

Figure 4:
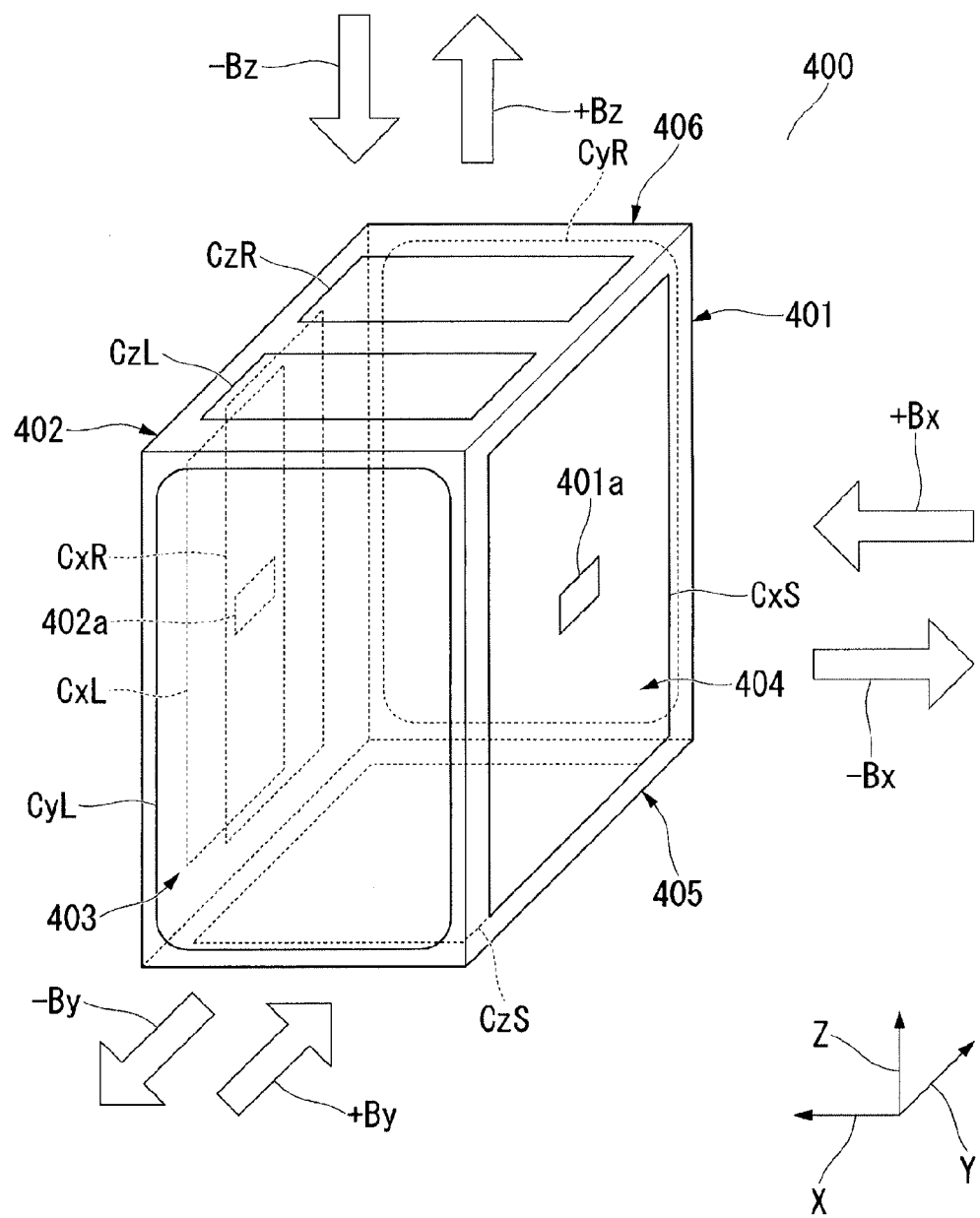
FIG. 4 is a diagram illustrating exemplary coils attached to a housing case 400.

Exemplary coils attached to the housing case 400 will be described below with reference to FIG. 4. FIG. 4 is a diagram illustrating exemplary coils attached to the housing case 400.

The housing case 400 includes the faces 401, 402 orthogonal to the X axis, the faces 403, 404 orthogonal to the Y axis, and the faces 405, 406 orthogonal to the Z axis. The face 401 is on the − side of the X axis relative to the center of the housing case 400, and the face 402 is on the + side of the X axis relative to the center of the housing case 400. The face 403 is on the − side of the Y axis relative to the center of the housing case 400, and the face 404 is on the + side of the Y axis relative to the center of the housing case 400. The face 405 is on the − side of the Z axis relative to the center of the housing case 400, and the face 406 is on the + side of the Z axis relative to the center of the housing case 400.

The face 401 and the face 402 are provided with passage ports 401a and 402a through which the conveyance belts 141 and 142 holding a paper note P penetrate, respectively. The passage ports 401a and 402a are provided at predetermined positions such that a paper note P and the conveyance belts 141 and 142 do not contact with the housing case 400 even when the conveyance belts 141 and 142 move while holding the paper note P.

The housing case 400 includes the 3D coil unit 410 for generating cancellation magnetic fields in the three axial directions. The cancellation magnetic field is directed for compensating for a magnetic field corresponding to an environment magnetic noise near the magnetic sensor 153. The 3D coil unit 410 includes eight coils CxS, CxL, CxR, CyL, CyR, CzS, CzL and CzR provided on the sides of the housing case 400. In the embodiment, the 3D coil unit 410 is attached on the inner periphery of the housing case 400. The 3D coil unit 410 is not limited thereto, and may be embedded in the housing case 400 or may be attached on the outer periphery of the housing case 400.

The coils CxS, CxL and CxR are directed for generating a cancellation magnetic field in the X axis direction.

The coil CxS is provided on the face 401 of the housing case 400. The coil CxS is provided at a position where the coil axis matches with the X axis and near the outer edge of the face 401.

The coils CxL and CxR are provided on the face 402 of the housing case 400. The coil CxL is provided on the left of the face 402 (on the left of the conveyance direction X), and the coil CxR is provided on the right of the face 402 (on the right of the conveyance direction X). The coils CxL and CxR are provided at the positions where the coil axes match with the X axis and the coil axes are different in the Y axis direction.

The coils CyL and CyR are directed for generating a cancellation magnetic field in the Y axis direction.

The coil CyL is provided on the face 403 of the housing case 400. The coil CyL is provided at a position where the coil axis matches with the Y axis and near the outer edge of the face 403.

The coil CyR is provided on the face 404 of the housing case 400. The coil CyR is provided at a position where the coil axis matches with the Y axis and near the outer edge of the face 404.

The coils CzS, CzL, and CzR are directed for generating a cancellation magnetic field in the Z axis direction.

The coil CzS is provided on the face 405 of the housing case 400. The coil CzS is provided at a position where the coil axis matches with the Z axis and near the outer edge of the face 405.

The coils CzL and CzR are provided on the face 406 of the housing case 400. The coil CzL is provide on the left of the face 406 (on the left of the conveyance direction X) and the coil CzR is provided on the right of the face 406 (on the right of the conveyance direction X). The coils CzL and CzR are provided at the positions where the coil axes match with the Z axis and the coil axes are different in the Y axis direction.

A current is flowed through the coils CxS, CxL and CxR, and thus a magnetic field is generated in the + direction or − direction of the X axis in the coil. In the embodiment, the directions in which the coils CxS, CxL and CxR are wound are the same, which are wound clockwise as viewed from the − direction of the X axis. Thus, when a clockwise current as viewed from the − direction of the X axis is flowed through the coils CxS, CxL and CxR, a magnetic field (+Bx) toward the + direction of the X axis is generated, and when a counterclockwise current as viewed from the − direction of the X axis is flowed through the coils CxS, CxL and CxR, a magnetic field (−Bx) toward the − direction of the X axis is generated.

A current is flowed through the coils CyL and CyR, and thus a magnetic field is generated in the + direction or − direction of the Y axis in the coils. In the embodiment, the directions in which the coils CyL and CyR are wound are the same, which are wound clockwise as viewed from the − direction of the Y axis. Thus, when a clockwise current as viewed from the − direction of the Y axis is flowed through the coils CyL and CyR, a magnetic field (+By) toward the + direction of the Y axis is generated, and when a counterclockwise current as viewed from the − direction of the Y axis is flowed through the coils CyL and CyR, a magnetic field (−By) toward the − direction of the Y axis is generated.

When a current is flowed through the coils CzS, CzL and CzR, a magnetic field is generated in the + direction or − direction of the Z axis in the coils. In the embodiment, the directions in which the coils CzS, CzL and CzR are wound are the same, which are wound clockwise as viewed from the − direction of the Z axis. Thus, when a clockwise current as viewed from the − direction of the Z axis is flowed in the coils CzS, CzL, and CzR, a magnetic field (+Bz) is generated toward the + direction of the Z axis, and when a counterclockwise current as viewed from the − direction of the Z axis is flowed through the coils CzS, CzL and CzR, a magnetic field (−Bz) is generated toward the − direction of the Z axis.

Figure 5:
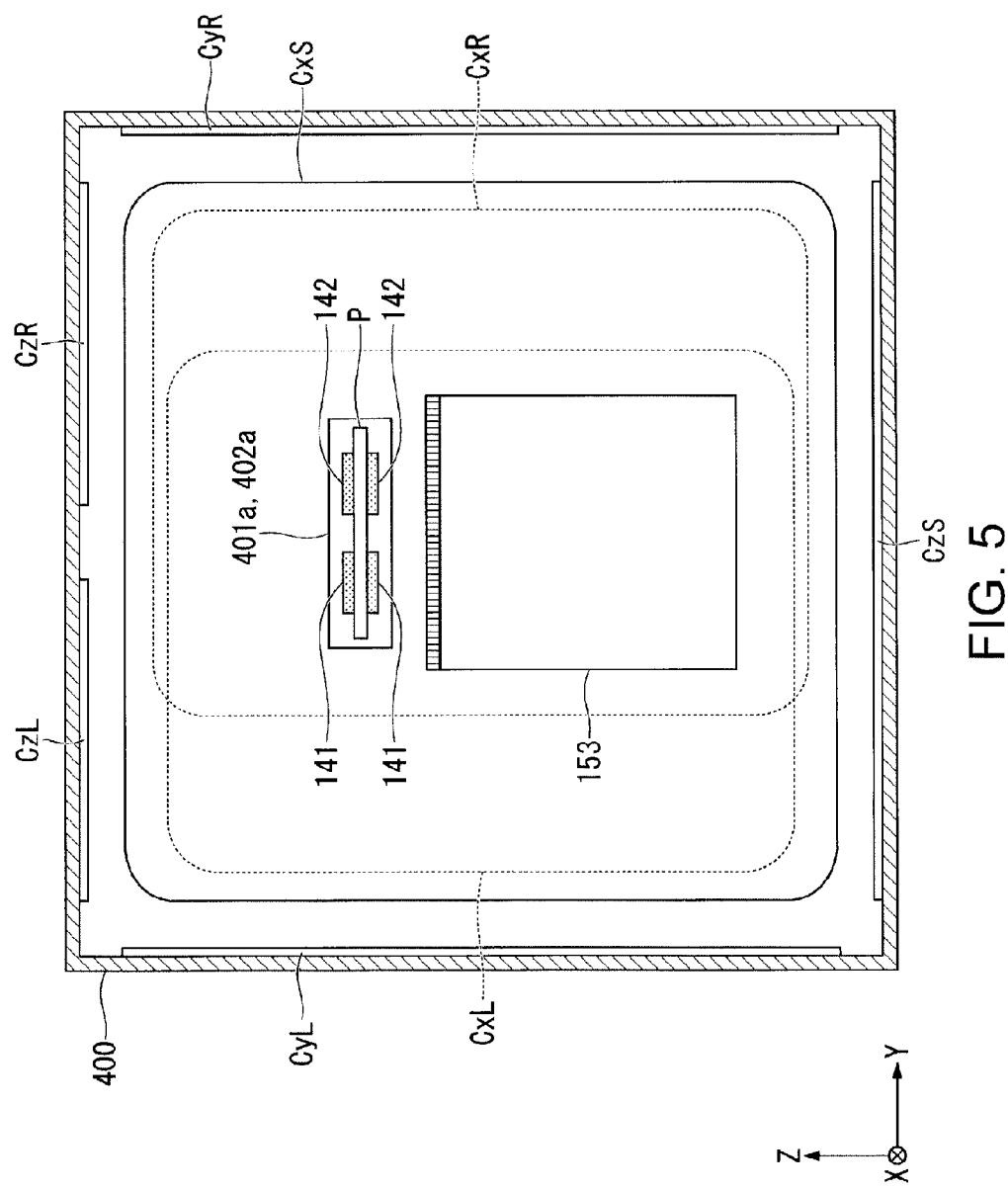
FIG. 5 is a diagram for explaining an exemplary positional relationship between the magnetic sensor 153 and a 3D coil unit 410.

An exemplary positional relationship between the magnetic sensor 153 and the 3D coil unit 410 will be described below with reference to FIG. 5. FIG. 5 is a diagram for explaining an exemplary positional relationship between the magnetic sensor 153 and the 3D coil unit 410.

The coil CxS provided on the face 401 of the housing case 400 is provided near the outer edge of the face 401 and away from the passage port 401a.

The coil CxL and the coil CxR are provided to be partially overlapped inside the coils as illustrated like the Venn diagram, and the passage ports 401a, 402a and the magnetic sensor 153 are located at the position where the part of the inside of the coil CxL and part of the inside of the coil CxR overlap each other.

In the embodiment, there is employed a positional relationship in which the coil axis of the coil CxS matches with or approximates the magnetic sensor array unit 300A. There is employed a positional relationship in which the coil axis of the coil CxL matches with or approximates a left-side correction magnetic sensor array 300L and the coil axis of the coil CxR matches with or approximates a right-side correction magnetic sensor array 300R.

Though not illustrated, there is employed a positional relationship in which the coil axis of the coil CyL matches with or approximates a left-side correction magnetic sensor array 300L and the coil axis of the coil CyR matches with or approximates a right-side correction magnetic sensor array 300R. There is employed a positional relationship in which the coil axis of the coil CzS matches with or approximates the magnetic sensor array unit 300A. There is employed a positional relationship in which the coil axis of the coil CzL matches with or approximates a left-side correction magnetic sensor array 300L and the coil axis of the coil CzR matches with or approximates a right-side correction magnetic sensor array 300R.

In this way, the coil axes match with or approximate the magnetic sensor array unit 300A so that a cancellation magnetic field generated by the 3D coil unit 410 can approximate an environment magnetic field near the magnetic sensor array unit 300A.

Figure 6:
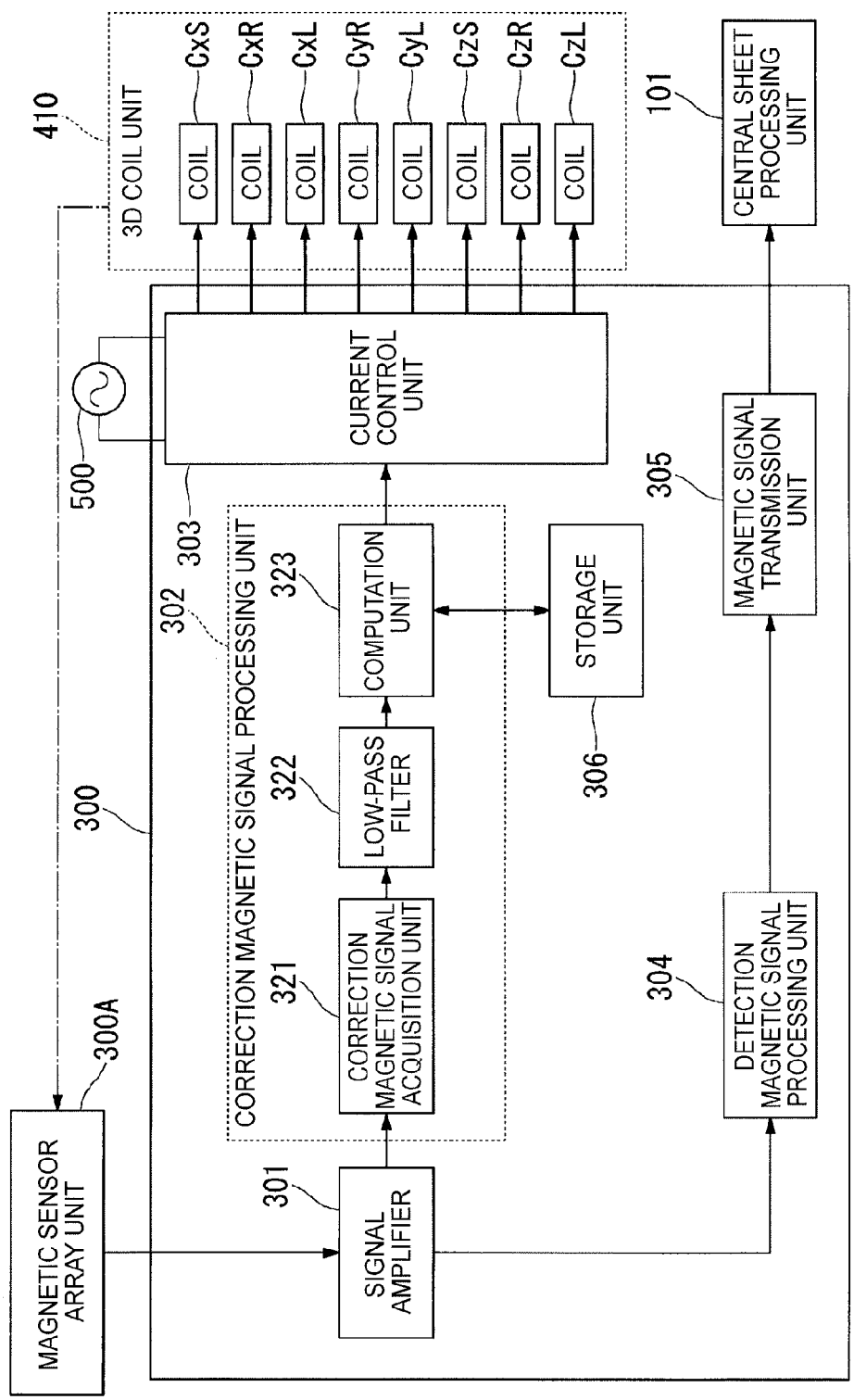
FIG. 6 is a block diagram illustrating an exemplary structure of a cancel device 300 included in the magnetic sensor 153.

An exemplary structure of the cancel device 300 included in the magnetic sensor 153 will be described below with reference to FIG. 6. FIG. 6 is a block diagram illustrating an exemplary structure of the cancel device 300 included in the magnetic sensor 153.

The cancel device 300 includes a signal amplifier 301, a correction magnetic signal processing unit 302, a current control unit 303, a detection magnetic signal processing unit 304, a magnetic signal transmission unit 305, and a storage unit 306.

The signal amplifier 301 amplifies an electric signal output from the magnetic sensor array unit 300A and outputs the amplified signal to 302 and 304. In the embodiment, the signal amplifier 301 outputs detection magnetic electric signals $(SX_6, SY_6, SZ_6), (SX_7, SY_7, SZ_7), \ldots, (SX_{n-5}, SY_{n-5}, SZ_{n-5})$ as electric signals output from the detection magnetic sensor arrays 300S to the detection magnetic signal processing unit 304. Further, the signal amplifier 301 outputs correction magnetic electric signals $(SX_1, SY_1, SZ_1), (SX_2, SY_2, SZ_2), \ldots, (SX_5, SY_5, SZ_5)$ as electric signals output from the left-side correction magnetic sensor arrays 300L and correction magnetic electric signals $(SX_{n-4}, SY_{n-4}, SZ_{n-4}), (SX_{n-3}, SY_{n-3}, SZ_{n-3}), \ldots, (SX_n, SY_n, SZ_n)$ as electric signals output from the right-side correction magnetic sensor arrays 300R to the correction magnetic signal processing unit 302.

The correction magnetic signal processing unit 302 includes a correction magnetic signal acquisition unit 321, a low-pass filter 322, and a computation unit 323.

The correction magnetic signal acquisition unit 321 acquires the correction magnetic electric signals output from the left-side correction magnetic sensor arrays 300L and the correction magnetic electric signals output from the right-side correction magnetic sensor arrays 300R among the electric signals output from the signal amplifier 301.

The low-pass filter 322 outputs an electric signal in which a high frequency component is removed from the input electric signal.

The computation unit 323 finds a coil current value for generating a cancellation magnetic field for compensating for an environmental magnetic noise from the 3D coil unit 410 based on an electric signal input from the low-pass filter 322. In the embodiment, the computation unit 323 finds a coil current value per magnetic component, and changes the current values supplied to the coils arranged on the left of the conveyance direction (X) and the coils arranged on the right depending on a difference in strength between the magnetic fields on the left and right of the conveyance direction (X). The magnetic field is a vector field and has a direction and a strength at each point in the space, and thus the computation unit 323 can perform vector addition on magnetic fields detected by the magnetic sensor array unit 300A thereby to calculate a magnetic flux density at each point in the space.

Herein, there are found a coil current IxS supplied to the coil CxS, a coil current IxL supplied to the coil CxL, a coil current IxR supplied to the coil CxR, a coil current IyL supplied to the coil CyL, a coil current IyR supplied to the coil CyR, a coil current IzS supplied to the coil CzS, a coil current IzL supplied to the coil CzL, and a coil current IzR supplied to the coil CzR. The computation unit 323 outputs the information on the found current values to the current control unit 303.

For example, the computation unit 323 finds the coil current values based on the correction values of the corrected correction magnetic electric signals with reference to the storage unit 306 by use of a plurality of functions for which parameters are set depending on external factors giving impacts on magnetic fields inside the housing case 400. The computation unit 323 finds a differential value of the amount of magnetism of each magnetic component based on the correction magnetic electric signal, and finds a correction value by use of a function of multiplying the found differential value by a differential parameter $\alpha$. Further, the computation unit 323 finds a correction value by use of a function of multiplying the amount of magnetism of each magnetic component by a magnetic amount parameter $\beta$ based on the correction magnetic electric signal. Furthermore, the computation unit 323 finds an integral value of the amount of magnetism of each magnetic component based on the correction magnetic electric signal, and finds a correction value by use of a function of multiplying the found integral value by an integral parameter $\gamma$. The computation unit 323 finds a coil current value by use of a function of multiplying a total value of found correction values by an electric parameter $\delta$.

The differential parameter α, the magnetic amount parameter β, the integral parameter γ, and the electric parameter δ are set depending on external factors giving impacts on magnetic fields inside the housing case 400. The external factors include temperature, moisture, operation time of the sheet processing apparatus 1, equipment mounted around the magnetic sensor 153, material of the housing case 400, and the like, for example. The parameters are experientially found by previous tests or the like.

The computation unit 323 compares a strength of a magnetic field detected by the left-side correction magnetic sensor arrays 300L with a strength of a magnetic field detected by the right-side correction magnetic sensor arrays 300R thereby to compute the coil correction values for correcting the coil current values supplied to the coils on the left of the conveyance direction (X) and the coil current values supplied to the coils on the right of the conveyance direction (X). The computation unit 323 determines the coil current values obtained by correcting the coil current values by the calculated coil correction values as the coil current values to be supplied to the coils on the left of the conveyance direction (X) and the coil current values to be supplied to the coils on the right.

Specifically, when the strength of the magnetic field detected by the left-side correction magnetic sensor arrays 300L is higher than the strength of the magnetic field detected by the right-side correction magnetic sensor arrays 300R, the computation unit 323 corrects the coil current values supplied to the coils on the left of the conveyance direction (X) by a coil correction value +ε and the coil current values supplied to the coils on the right by a coil correction value −ε. That is, a correction is made such that a cancellation magnetic field generated by the coils on the left of the conveyance direction (X) is stronger than a cancellation magnetic field generated by the coils on the right. The coil correction values ε are experientially found by previous tests or the like.

When the strength of the magnetic field detected by the left-side correction magnetic sensor arrays 300L is lower than the strength of the magnetic field detected by the right-side correction magnetic sensor arrays 300R, the computation unit 323 corrects the coil current values supplied to the coils on the left of the conveyance direction (X) by the coil correction value −ε, and corrects the coil current values supplied to the coils on the right by the coil correction value +ε. That is, a correction is made such that a cancellation magnetic field generated by the coils on the left of the conveyance direction (X) is smaller than a cancellation magnetic field generated by the coils on the right.

When the strength of the magnetic field detected by the left-side correction magnetic sensor arrays 300L is the same as the strength of the magnetic field detected by the right-side correction magnetic sensor arrays 300R, the computation unit 323 may not make a correction by use of both of the coil correction values at 0.

The current control unit 303 is connected to an AC power supply 500, and a plurality of coils CxS, CxR, CxL, CyR, CyL, CzS, CzR, and CzL. The current control unit 303 supplies currents depending on the current values input from the computation unit 323 to the coils CxS, CxR, CxL, CyR, CyL, CzS, CzR, and CzL from the AC power supply 500. The AC power supply 500 is directed for supplying power to the entire sheet processing apparatus 1.

The detection magnetic signal processing unit 304 acquires the detection magnetic electric signals output from the detection magnetic sensor arrays 300S among the electric signals output from the signal amplifier 301, and outputs them to the magnetic signal transmission unit 305.

The magnetic signal transmission unit 305 outputs the detection magnetic electric signals output from the detection magnetic signal processing unit 304 to the central sheet processing unit 101 by use of a digital serial communication system.

The storage unit 306 stores therein the differential parameter α, the magnetic amount parameter β, the integral parameter γ, the electric parameter δ, the coil correction values ±ε, and the like. The storage unit 306 may store therein the differential parameter α, the magnetic amount parameter β, the integral parameter γ, the electric parameter δ, the coil correction values ±ε, and the like previously determined depending on machine type, use period, use situation, use environment, operation time and the like of the sheet processing apparatus 1.

Figure 7:
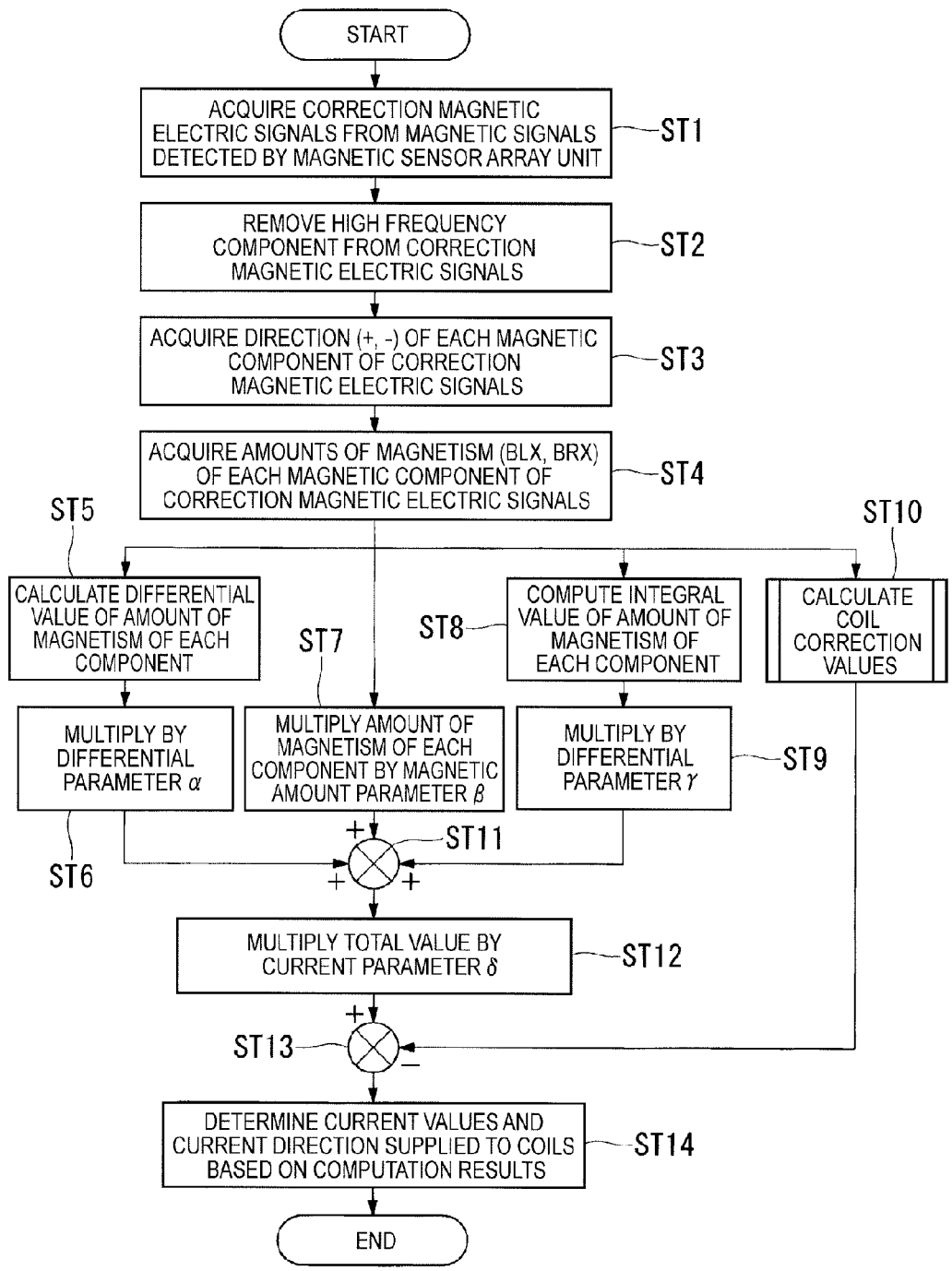
FIG. 7 is a flowchart for explaining exemplary processing in a correction magnetic signal processing unit 302.

Exemplary processing by the correction magnetic signal processing unit 302 will be described below with reference to FIG. 7. FIG. 7 is a flowchart for explaining the exemplary processing by the correction magnetic signal processing unit 302. The processing for magnetic components in the X axis direction will be described herein. The correction magnetic signal processing unit 302 performs the same processing as the processing described below on magnetic components in the Y axis direction and magnetic components in the Z axis direction.

The correction magnetic signal acquisition unit 321 in the correction magnetic signal processing unit 302 acquires magnetic components in the X axis direction of the correction magnetic electric signals from the signal amplifier 301 (step ST1). In the embodiment, the correction magnetic signal acquisition unit 321 acquires electric signals ($SX_1$, $SX_2$, $SX_3$, $SX_4$, $SX_5$) of the magnetic components in the X axis direction output from the magnetic sensor arrays A1 to A5 and electric signals ($SX_{n-4}$, $SX_{n-3}$, $SX_{n-2}$, $SX_{n-1}$, $SX_n$) of the magnetic components in the X axis direction output from the magnetic sensor arrays An-4 to An. The correction magnetic signal acquisition unit 321 outputs the acquired electric signals to the low-pass filter 322.

The low-pass filter 322 outputs the electric signals with high frequency components removed from the input electric signals to the computation unit 323 (step ST2).

The computation unit 323 acquires the direction (+, −) of the magnetic components in the X axis direction of the correction magnetic electric signals based on the electric signals input from the low-pass filter 322 (step ST3). That is, the computation unit 323 acquires information for indicating the orientation of the magnetic components in the X axis direction detected by the magnetic sensor arrays A1 to A5 or the magnetic sensor arrays An-4 to An in the + direction or − direction of the X axis. Herein, since the orientations of the magnetic components in the X axis direction detected by the magnetic sensor arrays A1 to A5 or the magnetic sensor arrays An-4 to An are assumed to match with each other, the computation unit 323 may acquire the orientation of the magnetic components in the X axis direction based on an electric signal. When it is assumed that the orientations of the magnetic components in the X axis direction do not match with each other, the computation unit 323 may acquire the orientation in which more than half of the electric signals match with each other as the orientation of the magnetic components in the X axis direction based on the detected electric signals.

The computation unit 323 acquires the amounts of magnetism (BLX, BRX) as the strengths of the magnetic fields of the magnetic components in the X axis direction of the correction magnetic electric signals based on the electric signals input from the low-pass filter 322 (step ST4). In the embodiment, the computation unit 323 averages the amounts of magnetism of the magnetic fields detected by the magnetic sensor arrays A1 to A5 based on the electric signals ($SX_1$, $SX_2$, $SX_3$, $SX_4$, $SX_5$) of the magnetic components in the X axis direction output from the magnetic sensor arrays A1 to A5, thereby acquiring the amount of magnetism (BLX). The computation unit 323 averages the amounts of magnetism of the magnetic fields detected by the magnetic sensor arrays An-4 to An based on the electric signals ($SX_{n-4}$, $SX_{n-3}$, $SX_{n-2}$, $SX_{n-1}$, $SX_n$) of the magnetic components in the X axis direction output from the magnetic sensor arrays An-4 to An, thereby acquiring the amount of magnetism (BRX).

The computation unit 323 averages the amounts of magnetism of the magnetic fields detected by the magnetic sensor arrays A1 to A5 and the magnetic sensor arrays An-4 to An based on the amounts of magnetism (BLX, BRX), thereby acquiring the amount of magnetism (BX).

The computation unit 323 calculates a differential value of the amount of magnetism (BX) of the magnetic components in the X axis direction (step ST5).

The computation unit 323 calls the differential parameter $\alpha$ from the storage unit 306, and multiplies the differential value of the amount of magnetism (BX) calculated in step ST5 by the differential parameter $\alpha$ (step ST6).

The computation unit 323 calls the magnetic amount parameter $\beta$ from the storage unit 306, and multiplies the amount of magnetism (BX) calculated in step ST4 by the magnetic amount parameter $\beta$ (step ST7).

The computation unit 323 calculates an integral value of the amount of magnetism (BX) of the magnetic components in the X axis direction (step ST8).

The computation unit 323 calls the integral parameter $\gamma$ from the storage unit 306, and multiplies the integral value of the amount of magnetism (BX) calculated in step ST8 by the integral parameter $\gamma$ (step ST9).

The computation unit 323 calculates coil correction values based on the amounts of magnetism (BRX, BLX) calculated in step ST4 (step ST10). The processing will be described in detail with reference to FIG. 8. The computation unit 323 finds a correction value of the coil CxL and a correction value of the coil CxR in the processing.

The computation unit 323 then finds a total value of the values calculated in steps ST6, 7 and 9 (step ST11). That is, the computation unit 323 finds a sum of the value obtained by multiplying the differential value of the amount of magnetism (BX) by the differential parameter $\alpha$, the value obtained by multiplying the amount of magnetism (BX) by the magnetic amount parameter $\beta$, and the value obtained by multiplying the integral value of the amount of magnetism (BX) by the integral parameter $\gamma$.

The computation unit 323 calls the electric parameter $\delta$ from the storage unit 306, and multiplies the total value calculated in step ST11 by the electric parameter $\delta$ (step ST12).

The computation unit 323 subtracts the coil correction value found in step ST10 from the value calculated in step ST12 (the value obtained by multiplying the total value by the electric parameter $\delta$) (step ST13). In the embodiment, the computation unit 323 finds a value obtained by subtracting the correction value of the coil CxL from the value obtained by multiplying the total value by the electric parameter $\delta$, and a value obtained by subtracting the correction value of the coil CxR from the value obtained by multiplying the total value by the electric parameter $\delta$.

The computation unit 323 then determines the current values and the current direction supplied to the coils CxS, CxL and CxR based on the above computation results (step ST14). In the embodiment, the computation unit 323 determines the value calculated in step ST12 (the value obtained by multi- plying the total value by the electric parameter $\delta$) as the value of the coil current IxS supplied to the coil CxS. Further, the computation unit 323 determines the value obtained by subtracting the correction value of the coil CxL from the value obtained by multiplying the total value by the electric parameter $\delta$ among the values calculated in step ST13 as the value of the coil current IxL supplied to the coil CxL. Furthermore, the computation unit 323 determines the value obtained by subtracting the correction value of the coil CxR from the value obtained by multiplying the total value by the electric parameter $\delta$ among the values calculated in step ST13 as the value of the coil current IxR supplied to the coil CxR.

The computation unit 323 determines the current direction flowing in the coils CxS, CxL and CxR based on the direction (+, −) of the magnetic components in the X axis direction of the environmental magnetic noise acquired in step ST3. In the embodiment, the computation unit 323 acquires information for indicating the orientation of the magnetic components in the X axis direction detected by the magnetic sensor arrays A1 to A5 or the magnetic sensor arrays An-4 to An in the + direction or − direction of the X axis. When the direction of the magnetic components in the X axis direction of the environmental magnetic noise is (+), the computation unit 323 determines the current direction flowing through the coils CxS, CxL and CxR as counterclockwise. Thereby, the direction (the − direction of the X axis) of the cancellation magnetic field generated by the coils CxS, CxL and CxR compensates for the direction (the + direction of the X axis) of the magnetic components in the X axis direction of the environmental magnetic noise.

Similarly, the computation unit 323 averages the amounts of magnetism in the Y axis direction of the magnetic fields detected by the magnetic sensor arrays A1 to A5 based on the electric signals ($SY_1$, $SY_2$, $SY_3$, $SY_4$, $SY_5$) of the magnetic components in the Y axis direction output from the magnetic sensor arrays A1 to A5, thereby acquiring the amount of magnetism (BLY) in the Y axis direction on the left of the conveyance direction X. The computation unit 323 averages the amounts of magnetism in the Y axis direction of the magnetic fields detected by the magnetic sensor arrays An-4 to An based on the electric signals ($SY_{n-4}$, $SY_{n-3}$, $SY_{n-2}$, $SY_{n-1}$, $SY_n$) of the magnetic components in the Y axis direction output from the magnetic sensor arrays An-4 to An, thereby acquiring the amount of magnetism (BRY) in the Y axis direction on the right of the conveyance direction X.

The computation unit 323 averages the amounts of magnetism in the Y axis direction of the magnetic fields detected by the magnetic sensor arrays A1 to A5 and the magnetic sensor arrays An-4 to An based on the amounts of magnetism (BLY, BRY), thereby acquiring the amount of magnetism (BY) in the Y axis direction.

The computation unit 323 performs steps ST5 to 12 based on the found amount of magnetism (BY) in the Y axis direction.

The computation unit 323 finds a value obtained by subtracting the correction value of the coil CyL from the value obtained by multiplying the total value in step ST11 by the electric parameter $\delta$, and a value obtained by subtracting the correction value of the coil CyR from the value obtained by multiplying the total value in step ST11 by the electric parameter $\delta$.

The computation unit 323 then determines the current values and the current direction supplied to the coils CyL and CyR based on the above computation results. In the embodiment, the computation unit 323 determines a value obtained by subtracting the correction value of the coil CyL from the value obtained by multiplying the total value by the electric parameter δ among the values calculated in step ST13 as the value of the coil current IyL supplied to the coil CyL. The computation unit 323 determines a value obtained by subtracting the correction value of the coil CyR from the value obtained by multiplying the total value by the electric parameter δ among the values calculated in step ST13 as the value of the coil current IyR supplied to the coil CyR.

The computation unit 323 determines the current direction flowing through the coils CyL and CyR based on the direction (+, −) of the magnetic components in the Y axis direction of the environmental magnetic noise acquired in step ST3. In the embodiment, the computation unit 323 acquires information for indicating the orientation of the magnetic components in the Y axis direction detected by the magnetic sensor arrays A1 to A5 or the magnetic sensor arrays An-4 to An in the + direction or − direction of the Y axis. When the direction of the magnetic components in the Y axis direction of the environmental magnetic noise is (+), the computation unit 323 determines the current direction flowing through the coils CyL and CyR as counterclockwise. Thereby, the direction (the − direction of the Y axis) of the cancellation magnetic field generated by the coils CyL and CyR compensates for the direction (the + direction of the Y axis) of the magnetic components in the Y axis direction of the environmental magnetic noise.

Similarly, the computation unit 323 averages the amounts of magnetism in the Z axis direction of the magnetic fields detected by the magnetic sensor arrays A1 to A5 based on the electric signals ($SZ_1$, $SZ_2$, $SZ_3$, $SZ_4$, $SZ_5$) of the magnetic components in the Z axis direction output from the magnetic sensor arrays A1 to A5, thereby acquiring the amount of magnetism (BLZ) on the left of the conveyance direction X in the Z axis direction. The computation unit 323 averages the amounts of magnetism in the Z axis direction of the magnetic fields detected by the magnetic sensor arrays An-4 to An based on the electric signals ($SZ_{n-4}$, $SZ_{n-3}$, $SZ_{n-2}$, $SZ_{n-1}$, $SZ_n$) of the magnetic components in the Z axis direction output from the magnetic sensor arrays An-4 to An, thereby acquiring the amount of magnetism (BRZ) on the right of the conveyance direction X in the Z axis direction.

Further, the computation unit 323 averages the amounts of magnetism in the Z axis direction of the magnetic fields detected by the magnetic sensor arrays A1 to A5 and the magnetic sensor arrays An-4 to An based on the amounts of magnetism (BLZ, BRZ), thereby acquiring the amount of magnetism (BZ) in the Z axis direction.

The computation unit 323 performs steps ST5 to 12 based on the found amount of magnetism (BZ) in the Z axis direction.

The computation unit 323 finds a value obtained by subtracting the correction value of the coil CzL from the value obtained by multiplying the total value in step ST11 by the electric parameter δ, and a value obtained by subtracting the correction value of the coil CzR from the value obtained by multiplying the total value in step ST11 by the electric parameter δ.

The computation unit 323 then determines the current values and the current direction supplied to the coils CzS, CzL and CzR based on the above computation results. In the embodiment, the computation unit 323 determines the value calculated in step ST12 (the value obtained by multiplying the total value by the electric parameter δ) as a value of the coil current IzS supplied to the coil CzS. Further, the computation unit 323 determines the value obtained by subtracting the correction value of the coil CzL from the value obtained by multiplying the total value by the electric parameter δ among the values calculated in step ST13 as a value of the coil current IzL supplied to the coil CzL. Furthermore, the computation unit 323 determines the value obtained by subtracting the correction value of the coil CzR from the value obtained by multiplying the total value by the electric parameter δ among the values calculated in step ST13 as a value of the coil current IzR supplied to the coil CzR.

The computation unit 323 determines the current direction flowing through the coils CzS, CzL and CzR based on the direction (+, −) of the magnetic components in the Z axis direction of the environmental magnetic noise acquired in step ST3. In the embodiment, the computation unit 323 acquires information for indicating the orientation of the magnetic components in the Z axis direction detected by the magnetic sensor arrays A1 to A5 or the magnetic sensor arrays An-4 to An in the + direction or − direction of the Z axis. When the direction of the magnetic components in the Z axis direction of the environmental magnetic noise is (+), the computation unit 323 determines the current direction flowing through the coils CzS, CzL and CzR as counterclockwise. Thereby, the direction (the − direction of the Z axis) of the cancellation magnetic field generated by the coils CzS, CzL and CzR compensates for the direction (the + direction of the Z axis) of the magnetic components in the Z axis direction of the environmental magnetic noise.

Figure 8:
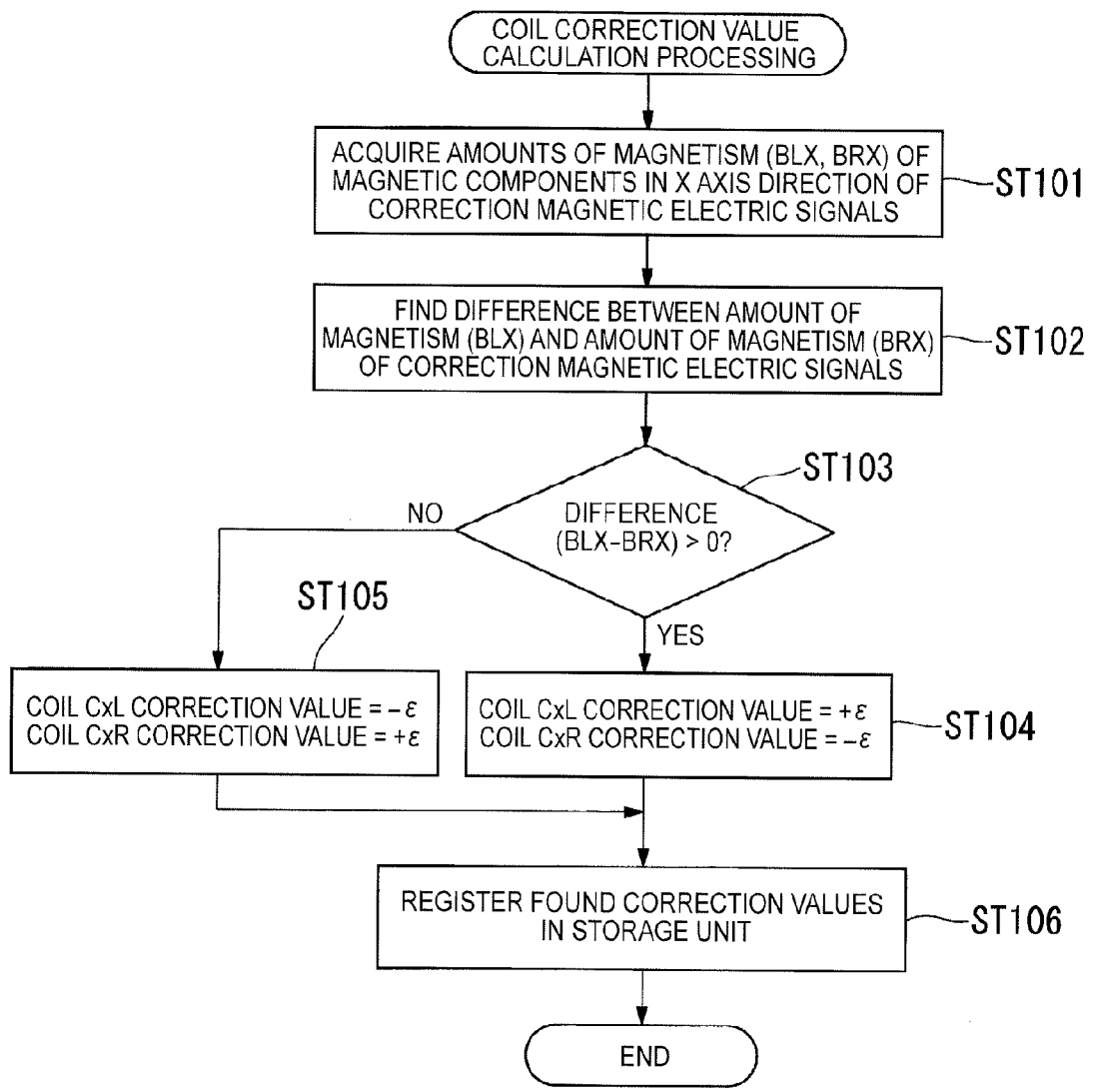
FIG. 8 is a flowchart for explaining an exemplary coil correction value calculation processing by a computation unit 323.

An exemplary coil correction value calculation processing by the computation unit 323 will be described below with reference to FIG. 8. FIG. 8 is a flowchart for explaining the exemplary coil correction value calculation processing by the computation unit 323. A processing of calculating coil correction values for correcting magnetic components in the X axis direction will be described herein. The correction magnetic signal processing unit 302 performs the same processing as the processing described below on magnetic components in the Y axis direction and magnetic components in the Z axis direction in parallel.

The computation unit 323 acquires the amounts of magnetism (BLX, BRX) as the strengths of the magnetic fields of the magnetic components in the X axis direction of the correction magnetic electric signals (step ST101). The processing is the same as step ST4.

The computation unit 323 finds a difference (BLX-BRX) between the found amounts of magnetism (BLX, BRX) in the X axis direction (step ST102).

The computation unit 323 determines whether the found difference (BLX-BRX) is larger than 0 (step ST103).

When determining that the found difference (BLX-BRX) is larger than 0 (step ST103: YES), the computation unit 323 determines a correction value +ϵ of the coil CxL and a correction value −ϵ of the coil CxR (step ST104).

On the other hand, when determining that the found difference (BLX−BRX) is not larger than 0 (step ST103: NO), the computation unit 323 determines the correction value −ϵ of the coil CxL and the correction value +ϵ of the coil CxR (step ST105).

The computation unit 323 then registers the found correction values in the storage unit 306 (step ST106).

Figure 9:
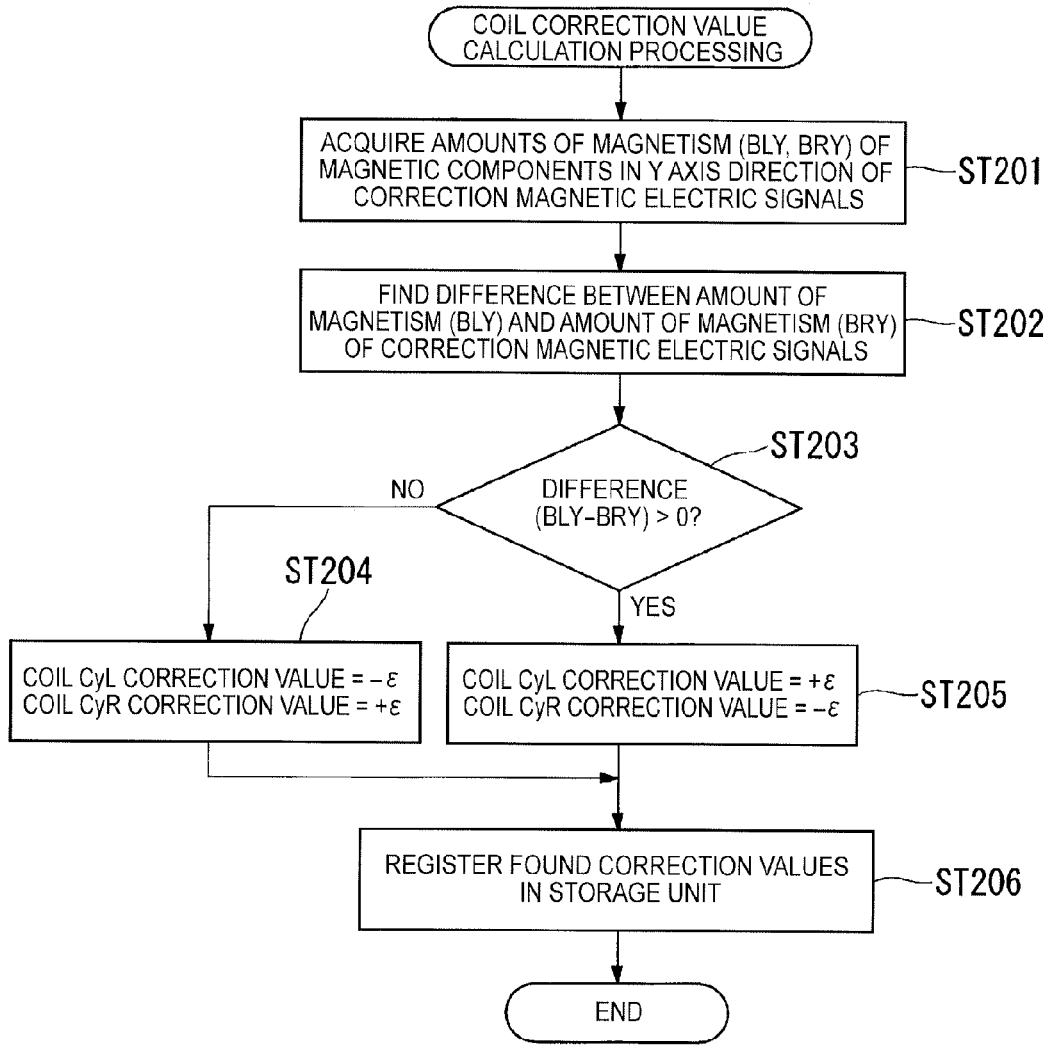
FIG. 9 is a flowchart for explaining an exemplary coil correction value calculation processing by the computation unit 323.

FIG. 9 is a flowchart for explaining an exemplary coil correction value calculation processing by the computation unit 323. A processing of calculating coil correction values for correcting magnetic components in the Y axis direction will be described herein.

The computation unit 323 acquires the amounts of magnetism (BLY, BRY) as the strengths of the magnetic fields of the magnetic components in the Y axis direction of the correction magnetic electric signals (step ST201). The processing is the same as step ST4.

The computation unit 323 finds a difference (BLY−BRY) between the acquired amounts of magnetism (BLY, BRY) in the Y axis direction (step ST202).

The computation unit 323 determines whether the found difference (BLY−BRY) is larger than 0 (step ST203).

When determining that the found difference (BLY−BRY) is larger than 0 (step ST203: YES), the computation unit 323 determines a correction value +ϵ of the coil CyL and a correction value −ϵ of the coil CyR (step ST204).

On the other hand, when determining that the found difference (BLY−BRY) is not larger than 0 (step ST203: NO), the computation unit 323 determines the correction value −ϵ of the coil CyL and the correction value +ϵ of the coil CyR (step ST205).

The computation unit 323 then registers the found correction values in the storage unit 306 (step ST206).

Figure 10:
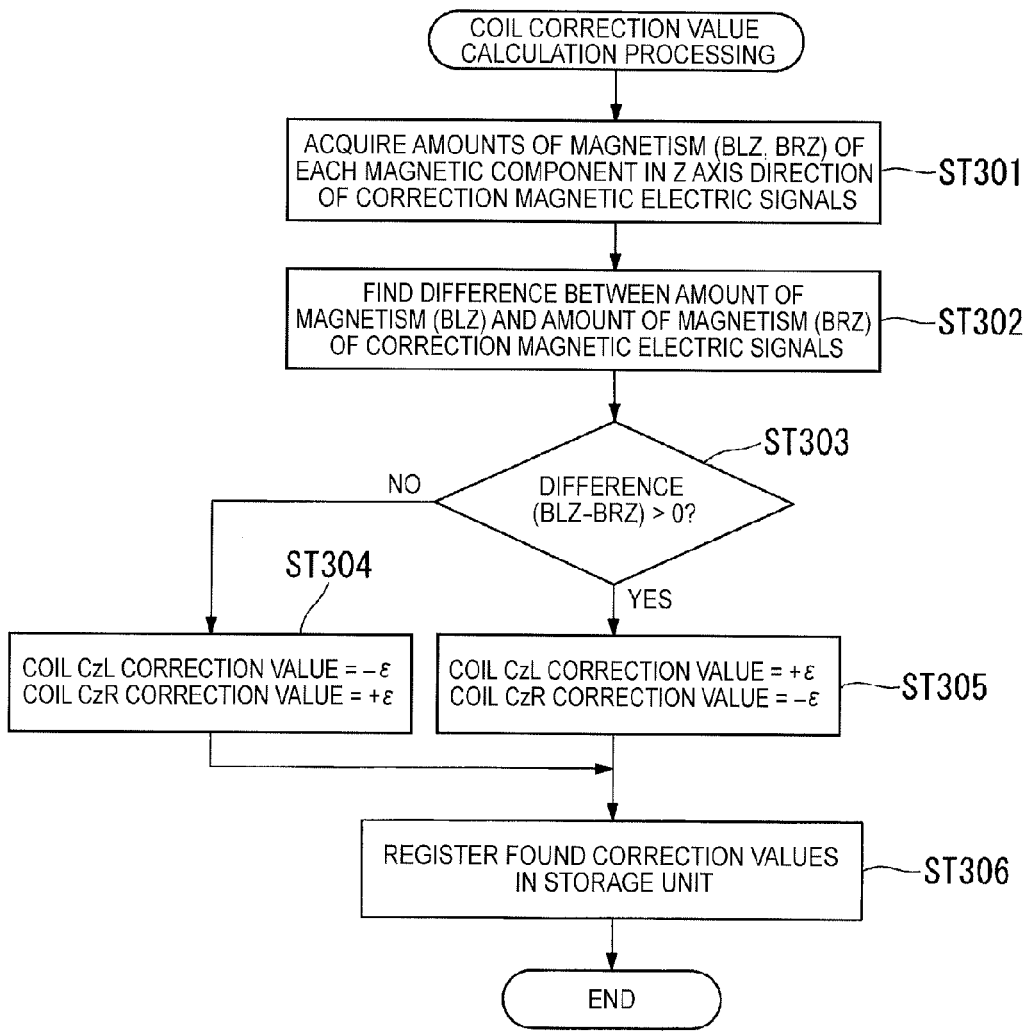
FIG. 10 is a flowchart for explaining an exemplary coil correction value calculation processing by the computation unit 323.

FIG. 10 is a flowchart for explaining an exemplary coil correction value calculation processing by the computation unit 323. A processing of calculating coil correction values for correcting magnetic components in the Z axis direction will be described herein.

The computation unit 323 acquires the amounts of magnetism (BLZ, BRZ) as the strengths of the magnetic fields of the magnetic components in the Z axis direction of the correction magnetic electric signals (step ST301). The processing is the same as step ST4.

The computation unit 323 finds a difference (BLZ−BRZ) between the acquired amounts of magnetism (BLZ, BRZ) in the Z axis direction (step ST302).

The computation unit 323 determines whether the found difference (BLZ−BRZ) is larger than 0 (step ST303).

When determining that the found difference (BLZ−BRZ) is larger than 0 (step ST303: YES), the computation unit 323 determines a correction value +ϵ of the coil CzL and a correction value −ϵ of the coil CzR (step ST304).

On the other hand, when determining that the found difference (BLZ−BRZ) is not larger than 0 (step ST303: NO), the computation unit 323 determines the correction value −ϵ of the coil CzL and the correction value +ϵ of the coil CzR (step ST305).

The computation unit 323 then registers the found correction values in the storage unit 306 (step ST306).

In the above embodiment, the housing case 400 is preferably made of a material having a function of reducing environmental magnetic noises intruding from the outside. The environmental magnetic noises can be reduced and the amount of current supplied to the 3D coil unit 410 can be restricted.

In the above embodiment, the correction magnetic signal processing unit 302 may include the correction magnetic signal acquisition unit 321, the low-pass filter 322 and the computation unit 323 as the function units functioning by performing a predetermined program, such as CPU (Central Processing Unit). Part or all of the function units may be hardware function units such as LSI (Large Scale Integration) or ASIC (Application Specific Integrated Circuit).

In the above embodiment, the computation unit 323 may recalculate the coil current values while the sheet processing apparatus 1 is operating. In that case, the computation unit 323 recalculates the coil current values based on the electric signals detected by the left-side correction magnetic sensor arrays 300L and the right-side correction magnetic sensor arrays 300R after a paper note P passes through the face opposing the magnetic sensor 153 and before a next paper note P passes through the face opposing the magnetic sensor 153, for example, while a cancellation magnetic field is not generated from the 3D coil unit 410. Thereby, a cancellation magnetic field approximate to an environmental magnetic noise when the magnetic sensor 153 detects magnetism of a paper note P can be generated based on the environmental magnetic noise detected immediately before the magnetic sensor 153 detects the magnetism of the paper note P.

The computation unit 323 may recalculate the coil current values while the sheet processing apparatus 1 is operating and a cancellation magnetic field is being generated from the coils. The computation unit 323 may recalculate the coil current values based on the electric signals detected by the left-side correction magnetic sensor arrays 300L and the right-side correction magnetic sensor arrays 300R while a cancellation magnetic field is being generated from the 3D coil unit 410. In this case, the environmental magnetic noise is cancelled by the cancellation magnetic field, and thus the left-side correction magnetic sensor arrays 300L and the right-side correction magnetic sensor arrays 300R detect the amounts of changed environmental magnetic noises. Thus, the computation unit 323 may recalculate the coil current values for generating the cancellation magnetic fields for compensating for the amounts of changed environmental magnetic noises detected this time based on the coil current values calculated based on the previous environmental magnetic noise. In this case, the differential parameter α, the magnetic amount parameter β, the integral parameter γ, the electric parameter δ and the like may be directed for recalculating the coil current values for generating a cancellation magnetic field for compensating for the amount of changed environmental magnetic noises.

In the above embodiment, since the magnetic sensor array unit 300A is a line-shaped contactless type magnetic sensor array, the environmental magnetic noises given to the magnetic sensor devices on the magnetic sensor array unit 300A may be slightly offset, and the generated cancellation magnetic field cannot be uniformly given to the entire magnetic sensor array unit 300A. Thus, the amounts of magnetism between the magnetic sensor devices may be corrected, but are not limited thereto. Therefore, a correction using such parameters may not be made.

According to at least one embodiment described above, the magnetic sensor 153 for detecting magnetism of a paper note P conveyed along the conveyance path and a magnetic field near it, the 3D coil unit 410 provided in the housing case 400 for housing the magnetic sensor 153 therein, and the cancel device 300 for generating a cancellation magnetic field for cancelling an environmental magnetic noise based on the near magnetic field from the 3D coil unit 410 are provided, thereby enhancing an accuracy of detecting magnetism of a paper note P.

Part of the magnetic sensor 153 is provided at a position opposing a paper note P moving in the conveyance path and other part thereof is provided at a position not opposing a paper note P moving in the conveyance path. Thereby, the magnetic sensor 153 can physically divide the detection magnetic sensor arrays 300S and the correction magnetic sensor arrays (the right-side correction magnetic sensor arrays 300R and the left-side correction magnetic sensor arrays 300L), and can easily classify an electric signal for detecting magnetism of a paper note P and an electric signal for detecting magnetism of an environmental magnetic noise.

Thus, magnetism of the environmental magnetic noise can be easily detected by only acquiring the electric signals from the correction magnetic sensor arrays (the right-side correction magnetic sensor arrays 300R and the left-side correction magnetic sensor arrays 300L) while no current is supplied to the 3D coil unit 410.

The magnetic sensor 153 detects the magnetic components in the three axial directions, and the 3D coil unit 410 includes a plurality of coils CxS, CxL, CxR, CyL, CyR, CzS, CzL, and CzR having the coil axes matching with the three axial directions. Thereby, the cancel device 300 can generate a cancellation magnetic field for compensating for an environmental magnetic noise in the respective directions based on the respective electromagnetic amounts in the three axial directions included in the environmental magnetic noise. Thus, the generated cancellation magnetic field has a reverse phase to the environmental magnetic noise and can compensate for the environmental magnetic noise, thereby uniformly reducing the environmental magnetic noise included in magnetism detected by the magnetic sensor 153.

The computation unit 323 in the cancel device 300 calculates the current values supplied to the 3D coil unit 410 based on the correction values for correcting information detected by the magnetic sensor 153 by a plurality of functions for which the parameters (such as $\alpha$, $\beta$, $\gamma$ and $\delta$) are set depending on external factors giving impacts on magnetic fields near the magnetic sensor 153. The cancel device 300 can calculate the current values for generating a cancellation magnetic field for compensating for an environmental magnetic noise in consideration of a change experientially estimated by previous tests or the like. Thus, an environmental magnetic noise included in magnetism detected by the magnetic sensor 153 can be effectively reduced.

The magnetic sensor array unit 300A includes the left-side correction magnetic sensor arrays 300L and the right-side correction magnetic sensor arrays 300R provided on both sides of a paper note P moving in the conveyance path.

Further, the 3D coil unit 410 includes the coils CxL and CxR and the coils CzL and CzR in which the coil axes are arranged at different positions in the Y axis orthogonal to the conveyance direction (X) of the paper notes P. The cancel device 300 changes the current values to the coils CxL and CxR and the coils CzL and CzR based on magnetism detected by the left-side correction magnetic sensor arrays 300L as the magnetic sensors on the left of the conveyance direction and the right-side correction magnetic sensor arrays 300R as the magnetic sensors on the right of the conveyance direction. Thereby, even when magnetism inside the housing case 400 is different between left and right in the conveyance direction, the cancellation magnetic fields with different values are generated from the right-side coils and the left-side coils thereby to cancel the environmental magnetic noise.

The embodiment includes the following aspects as described above.

(1) The correction magnetic sensors detect an environmental magnetic field before a sheet passes, for example.

(2) An environmental magnetic field is detected in a period after a sheet passes and before a next sheet passes, that is, during an absent period, for example.

(3) The coil current values are recalculated in a desired period during operation.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sheet processing apparatus comprising:
a contactless type detection magnetic sensor for detecting magnetism of a sheet;
correction magnetic sensors for detecting a magnetic field near the detection magnetic sensor;
coils arranged near the detection magnetic sensor; and
a cancel device for generating a cancellation magnetic field from the coils for cancelling a magnetic field near the detection magnetic sensor based on a detection result of the correction magnetic sensors;
wherein the detection magnetic sensor is provided to oppose the sheet, and
the correction magnetic sensors are provided not to oppose the sheet.

2. The sheet processing apparatus according to claim 1, wherein the detection magnetic sensor and the correction magnetic sensors detect magnetic components in three axial directions, and
the coils include a plurality of coils having coil axes matching with the three axial directions.

3. The sheet processing apparatus according to claim 1, wherein the cancel device further comprises a computation unit for calculating current values supplied to the coils based on correction values obtained by correcting information on a magnetic field detected by the correction magnetic sensors by a plurality of functions for which parameters are set depending on external factors giving impacts on a magnetic field near the detection magnetic sensor.

4. The sheet processing apparatus according to claim 1, wherein the correction magnetic sensors include a first correction magnetic sensor and a second correction magnetic sensor provided on both sides of the sheet moving in a conveyance path,
the first correction magnetic sensor is provided on one side of the direction orthogonal to the conveyance direction of the sheet, and
the second correction magnetic sensor is provided on the other side of the direction orthogonal to the conveyance direction of the sheet.

5. The sheet processing apparatus according to claim 4, wherein the coils include a first coil and a second coil in which the coil axes are arranged at different positions in the direction orthogonal to the conveyance direction of the sheet, and
the cancel device changes current values supplied to the first coil and the second coil based on magnetism detected by the first correction magnetic sensor and magnetism detected by the second correction magnetic sensor.

6. The sheet processing apparatus according to claim 5, wherein the first coil is arranged at a position corresponding to the first correction magnetic sensor and the second coil is arranged at a position corresponding to the second correction magnetic sensor.

7. The sheet processing apparatus according to claim 1, wherein the coils are 3D coils.

8. The sheet processing apparatus according to claim 1, wherein a determination is made as to whether the sheet is normal or damaged and true or false, and a sheet determined as damaged or false is recovered.

9. The sheet processing apparatus according to claim 1, wherein the correction magnetic sensors detect magnetism while no current is supplied to the coils.

10. The sheet processing apparatus according to claim 1, wherein the correction magnetic sensors detect a magnetic field before a sheet passes.

11. The sheet processing apparatus according to claim 1, wherein a magnetic field is detected after a sheet is passes and before a next sheet passes.

12. The sheet processing apparatus according to claim 1, wherein the correction magnetic sensors detect an environmental magnetic field.

13. The sheet processing apparatus according to claim 1, wherein coil current values are recalculated in a desired period during operation.

14. A sheet processing apparatus comprising:
a contactless type detection magnetic sensor for detecting magnetism of a sheet;
correction magnetic sensors for detecting a magnetic field near the detection magnetic sensor;
coils arranged near the detection magnetic sensor; and
a cancel device for generating a cancellation magnetic field from the coils for cancelling a magnetic field near the detection magnetic sensor based on a detection result of the correction magnetic sensors;
wherein the detection magnetic sensor and the correction magnetic sensors detect magnetic components in three axial directions, and
the coils include a plurality of coils having coil axes matching with the three axial directions.

15. A sheet processing apparatus comprising:
a contactless type detection magnetic sensor for detecting magnetism of a sheet;
correction magnetic sensors for detecting a magnetic field near the detection magnetic sensor;
coils arranged near the detection magnetic sensor; and
a cancel device for generating a cancellation magnetic field from the coils for cancelling a magnetic field near the detection magnetic sensor based on a detection result of the correction magnetic sensors;
wherein the cancel device further comprises a computation unit for calculating current values supplied to the coils based on correction values obtained by correcting information on a magnetic field detected by the correction magnetic sensors by a plurality of functions for which parameters are set depending on external factors giving impacts on a magnetic field near the detection magnetic sensor.

16. A sheet processing apparatus comprising:
a contactless type detection magnetic sensor for detecting magnetism of a sheet;
correction magnetic sensors for detecting a magnetic field near the detection magnetic sensor;
coils arranged near the detection magnetic sensor; and
a cancel device for generating a cancellation magnetic field from the coils for cancelling a magnetic field near the detection magnetic sensor based on a detection result of the correction magnetic sensors;
wherein the coils are 3D coils.

17. A sheet processing apparatus comprising:
a contactless type detection magnetic sensor for detecting magnetism of a sheet;
correction magnetic sensors for detecting a magnetic field near the detection magnetic sensor;
coils arranged near the detection magnetic sensor; and
a cancel device for generating a cancellation magnetic field from the coils for cancelling a magnetic field near the detection magnetic sensor based on a detection result of the correction magnetic sensors;
wherein the correction magnetic sensors detect magnetism while no current is supplied to the coils.

* * * * *